Feb. 22, 1955 J. R. HAYNES 2,702,838

SEMICONDUCTOR SIGNAL TRANSLATING DEVICE

Filed Nov. 15, 1951

INVENTOR
J. R. HAYNES
BY
ATTORNEY

United States Patent Office 2,702,838 Patented Feb. 22, 1955

2,702,838

SEMICONDUCTOR SIGNAL TRANSLATING DEVICE

James R. Haynes, Chatham, N. J., assignor to Bell Telephone Laboratories, Incorporated, New York, N. Y., a corporation of New York Application November 15, 1951, Serial No. 256,541

2 Claims. (Cl. 179—171)

This invention relates to semiconductor signal translating devices and more particularly to such devices of the class known as transistors.

Transistors comprise, in general, a body of semiconductive material having a substantially ohmic connection, termed the base, and a second connection, termed the collector, thereto, the collector being biased, in operation, in the reverse direction thereby to attract carriers of the sign opposite that of the carriers normally present in excess in the body. They comprise also an emitter element which functions to inject into the body carriers of the opposite sign and in quantity representative of signals to be translated. In one known form of device, disclosed in Patent 2,524,035, October 3, 1950, of W. H. Brattain and J. Bardeen, the emitter and collector are point contacts bearing against the semiconductor, signals are impressed between the emitter and base and amplified replicas of these signals are obtained at a load connected between the collector and the base. If the semiconductor body is of P conductivity type, the carriers normally in excess therein are holes, the injected carriers are electrons and the collector is biased positive thereby to attract these electrons. If the semiconductor is of N-type, the normally excess carriers are electrons, the injected carriers are holes and the collector is biased negative.

In devices of the type above described and where the semiconductor is silicon, it has been found that distortion of signals obtains particularly at low input signal levels. For example, it has been found that a collector current pulse resulting from a sharp pulse applied to the emitter is spread in time and characterized by a trailing portion of substantial length. In typical cases, for an emitter pulse of essentially square wave form and about 5 microseconds duration, the corresponding collector pulse, although having a sharp rise time, falls rapidly to about 40 per cent of its maximum but thereafter decays substantially exponentially with a time constant of about 60 microseconds. Such absence of conformity between input and output pulses obviously is undesirable.

One general object of this invention is to improve the performance characteristics of transistors, and particularly of such devices wherein the body is of silicon. More specifically, one object of this invention is to reduce distortion in silicon translating devices thereby to enable high fidelity translation of signals.

In translating devices of the type to which this invention pertains, some spreading of the signals or pulses translated is to be anticipated not only because of differences in the path lengths traversed by the injected carriers in flowing from the emitter to the collector, with consequent variations in the transit times but also because of diffusion. However, the elongated tail on the collector pulse, noted hereinabove, is not explicable on this basis. It has been established, though, that such tail and like distortion in silicon devices involve a transit time effect attributable to the presence, in silicon, of traps which act upon the injected carriers and hold a portion of them temporarily, and, further, that in silicon of resistivities usually employed, say of the order of 40 ohm centimeters, the number of such traps is small.

In accordance with one feature of this invention, in silicon signal translating devices, signal distortion of the character noted hereinabove is substantially eliminated by effectively flooding the traps therein with minority carriers, that is carriers of the same sign as those injected at the emitter. Such flooding may be effected in several ways. In one, the silicon body is irradiated with light. In another, an auxiliary emitter is provided. In both, minority carriers are produced in the body in sufficient quantity to substantially eliminate the effect of the traps upon the carriers involved in the signal translation process. The quantity of the added carriers required is exceedingly small, in typical cases resulting in a change of less than 0.5 per cent in the conductivity of the silicon. Hence, in devices constructed in accordance with this invention, trapping effects are substantially eliminated with negligible power expenditure and without deleterious alteration of the conduction characteristics of the silicon.

The invention and the above noted and other features thereof will be understood more clearly and fully from the following detailed description with reference to the accompanying drawing in which.

Figure 1:
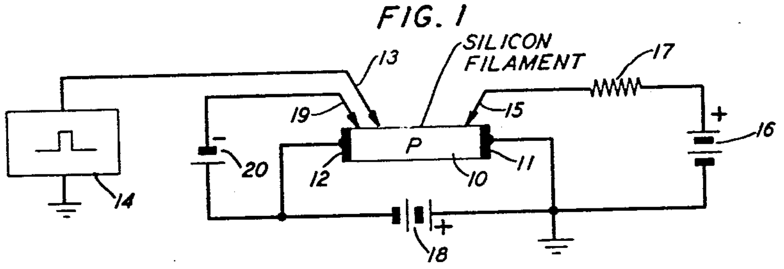
Fig. 1 is a diagram depicting a silicon translating device illustrative of one embodiment of this invention.

Referring now to the drawing, the signal translating device illustrated in Fig. 1 is of the general type disclosed in the application Serial No. 50,894, filed September 24, 1948, now Patent 2,600,500, granted June 17, 1952, of J. R. Haynes and W. Shockley. It comprises a body or filament 10 of silicon, for example of P conductivity type as indicated. Ohmic connections 11 and 12 are made to opposite ends of the body, either, or both, of these serving as the base element. Bearing against one face of the body, adjacent one end thereof, is an emitter 13, for example a point contact by way of which signals from a source 14 are impressed upon the body. A second asymmetric connection, also for example in the form of a point contact 15, bears against the filament 10 adjacent the other end thereof and is biased in the reverse direction relative to the body or filament by a source 16, the latter being in series with a load represented by the resistor 17. A suitable direct-current source 18 is connected between the ohmic terminals 11 and 12 and so poled as to accelerate charges injected at the emitter 13 toward the collector 15. When the body or filament 10 is of P conductivity type, the carriers injected at the emitter 13 are electrons, the collector is biased positive relative to the body thereby to accelerate the injected electrons and the source 18 has its positive pole connected to the terminal 11.

Also bearing against the semiconductor, advantageously adjacent the emitter 13 and more remote from the collector 15 than is the emitter 13, is an auxiliary electrode 19, for example, a point contact, which is biased by source 20 at the polarity to inject into the semiconductor carriers of the same sign as those injected by the emitter 13.

Figure 2A:
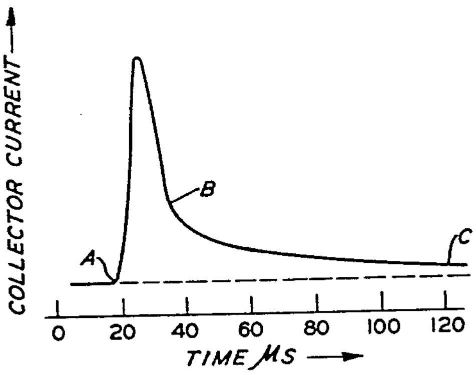
Figs. 2A and 2B are graphs illustrating performance characteristics of typical devices embodying this invention.
Figure 2B:
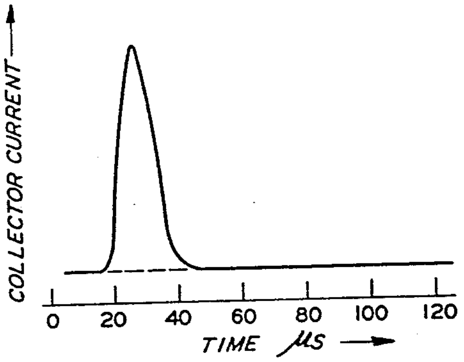

The performance and function of the auxiliary electrode 19 will be understood more readily from a consideration of Figs. 2A and 2B wherein the abscissae are time in microseconds and the ordinates are collector current. The collector current depicted is that for a substantially square pulse of about 5 microseconds duration applied to the emitter 13. When the auxiliary electrode 19 is absent the collector current pulse, due to the 5 microsecond pulse applied to the emitter, varies as shown in Fig. 2A. It will be noted that this collector current pulse is characterized by a sharp rise time followed by a relatively fast decay from the maximum amplitude and then by an exponential tail. It will be noted also that the width of the pulse measured from its inception to a value of approximately 60 per cent of the maximum beyond the peak is substantially 15 microseconds. Beyond this point the current decay is substantially exponential, the exponentially decaying tail portion having time constant of about 60 microseconds.

With the auxiliary electrode 19 in circuit, however, the collector current resulting from the 5 microsecond pulse applied to the input 13 is of the form portrayed in Fig. 2B. From this figure it will be noted that the effect of the auxiliary electrode 19 is to eliminate the elongated tail appearing in Fig. 2A.

The principles and parametral relations involved in this elimination of distortion will be understood from the following considerations. As has been noted hereinbefore, the spreading of the pulse, say from A to B in Fig. 2A, is partly attributable to the difference in path lengths, but is largely due to diffusion of the injected carriers in flowing from the emitter to the collector. However, the exponential decay of the collector pulse is not explicable on this basis.

This decay, or the tail on the collector pulse, which in the specific case illustrated has a time constant of about 60 microseconds, is attributable to a temporary trapping in the silicon of some of the carriers injected at the emitter. It seems clear from the form of the collector pulse, specifically the general symmetry of the major portion thereof in Fig. 2A, and the fact that there is no substantial time shift in the peak for the two conditions represented in Figs. 2A and 2B, that a large fraction of the carriers are not trapped in traversing the silicon filament and that the remainder, on the average, are temporarily trapped a small number of times. Of the electrons reaching the collector which have been trapped, only about one-fourth will be trapped more than once and about three-fourths once only. The decay constant, 60 microseconds, is, therefore, approximately the average time an electron spends in a trap. It has been established affirmatively that the number of additional carriers requisite to eliminate the pulse tail is very small. In the specific case of a single crystal silicon filament of the order 40 ohm centimeter resistivity, the requisite additional carriers alter the conductivity by less than 0.5 per cent. Further, it has been determined that the concentration of injected carriers in the conduction band necessary to keep half the traps filled is about $1\times10^{11}$. This concentration of injected carriers may be supplied to a silicon rod having cross-sectional dimensions of one millimeter and an applied electric field of 10 volts per centimeter by a current of the order of a few microamperes. Thus, the effects of traps can be eliminated at a very small expenditure of power. For example, in a typical device of the construction illustrated in Fig. 1 and disclosed hereinabove, the collector pulse tail may be eliminated through use of an auxiliary emitter 19 biased at about 0.2 volt. In a typical device of the construction illustrated in Fig. 3, such elimination is realized by irradiating the filament with $10^{13}$ light quanta per second having energies in excess of 1 electron volt. These quanta may be supplied by approximately 10 foot candles of light intensity from an incandescent tungsten lamp with a color temperature of 2900° K.

Figure 3:
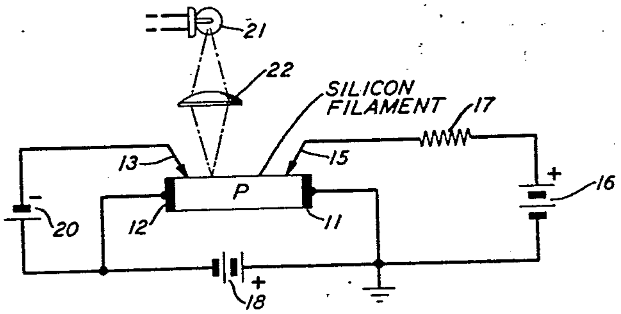
Figs. 3 and 4 are diagrams portraying other illustrative embodiments of this invention.

The embodiment of the invention illustrated in Fig. 3 is similar to that shown in Fig. 1 and described hereinabove. However, instead of an auxiliary electrode 19, a source of light 21 and associated lens 22 are utilized to produce electron hole pairs in the silicon body or filament 10 thereby to provide sufficient carriers to effectively flood the traps in the silicon.

Figure 4:
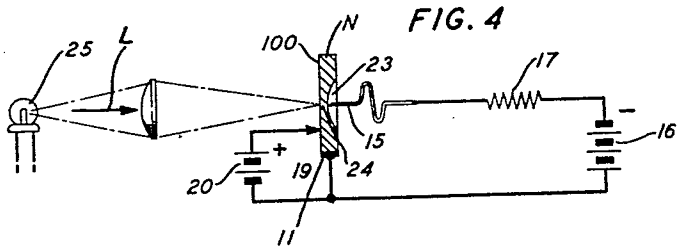

Fig. 4 illustrates the application of this invention to devices of the general type disclosed in the application Serial No. 85,788, filed April 16, 1949, now Patent 2,560,606, granted July 17, 1951, of J. N. Shive and known as phototransistors. In this device, the silicon body 100 has therein a recess 23 whereby there is produced a thin section 24 in the body. Bearing against one surface of the semiconductor, advantageously at the base of the recess 23, is the collector 15 which, as shown, is biased in the reverse direction with respect to the base 11 as by a direct-current source 16. Light of variable intensity indicated by the broken line outline L, emanating from the source 25, is directed against the opposite face of the silicon body 100 at a region opposite the point of contact of the collector 15. The intensity of the light is varied in known ways in accordance with signals to be translated whereby corresponding variations are produced in the current supplied to the load 17.

The auxiliary emitter 19 bears against the silicon body 100 on the opposite face mentioned and advantageously in proximity to the point of incidence of the light on this face. It is biased in the forward direction by a source 20 so that it injects into the semiconductor 100 carriers of the sign opposite that of those normally present in excess in the body. For the specific construction illustrated in Fig. 4 wherein the body is of N conductivity type, the carriers normally in excess are electrons so that the auxiliary emitter 19 is biased positive relative to the base thereby to inject holes into the semiconductor.

Although several specific embodiments of the invention have been shown and described it will be understood that they are but illustrative and that various modifications may be made therein without departing from the scope and spirit of this invention.

What is claimed is:

1. A signal translating device comprising a body of silicon, base and collector connections to said body, an input pulse signal source, means including said source for injecting into said body carriers of the sign opposite that of the carriers normally present in excess in said body, and means separate from said first means for substantially filling traps in said body with carriers of said sign so that just sufficient carriers of said sign are inserted to, in effect, fill said traps to an extent sufficient to afford an output pulse from said device having a duration not significantly exceeding the duration of the input pulse.

2. A signal translating device comprising a filament of P-type silicon, substantially ohmic connections to opposite ends of said filament, a collector connection to said filament adjacent one end thereof, an emitter connection to said filament adjacent the other end thereof, an input pulse signal source connected to said emitter connection, an auxiliary electrode engaging said filament in proximity to said emitter connection, and a direct-current source biasing said auxiliary electrode to cause injection thereby of electrons into said filament in quantity so that just sufficient minority carriers are inserted to, in effect, fill traps in said filament to an extent sufficient to afford a collector pulse having a duration not significantly exceeding the duration of the emitter pulse.

References Cited in the file of this patent

UNITED STATES PATENTS

| | | |
|---|---|---|
| 2,476,323 | Rack | July 19, 1949 |
| 2,524,035 | Bardeen et al. | Oct. 3, 1950 |
| 2,553,490 | Wallace | May 15, 1951 |
| 2,560,606 | Shire | July 17, 1951 |
| 2,570,978 | Pfann | Oct. 9, 1951 |
| 2,600,500 | Haynes et al. | June 17, 1952 |
| 2,624,016 | White | Dec. 30, 1952 |
| 655,607 | Reeves | Oct. 13, 1953 |